United States Patent
Kato et al.

[11] Patent Number: 5,590,455
[45] Date of Patent: Jan. 7, 1997

[54] APPARATUS FOR MANUFACTURING A PRINTED CIRCUIT BOARD

[75] Inventors: Taku Kato; Yasunori Hiroshima; Akinao Adachi; Akira Nakano; Kiyoshi Shimomura, all of Tokyo, Japan

[73] Assignee: Pioneer Electronic Corporation, Tokyo, Japan

[21] Appl. No.: 374,125

[22] Filed: Jan. 18, 1995

[30] Foreign Application Priority Data

Jan. 21, 1994 [JP] Japan .................. 6-022229

[51] Int. Cl.$^6$ .................................................. H01R 43/00
[52] U.S. Cl. .......................... 29/564.1; 29/33 M; 29/739
[58] Field of Search ..................... 29/33 M, 837, 29/845, 564.6, 366.1, 566.3, 564.1, 564.7, 739; 364/468; 227/73, 76, 110, 116

[56] References Cited

U.S. PATENT DOCUMENTS

| | | |
|---|---|---|
| 4,166,316 | 9/1979 | Misawa et al. ..................... 29/845 |
| 4,265,013 | 5/1981 | Brown et al. ....................... 29/739 |
| 4,333,233 | 6/1982 | Dodson et al. ..................... 29/845 |
| 4,501,065 | 2/1985 | Zemek et al. ...................... 29/845 |
| 4,573,263 | 3/1986 | De Rossi ............................. 29/741 |
| 4,590,659 | 5/1986 | Yagi et al. ........................ 29/564.6 |
| 4,672,735 | 6/1987 | Tamano et al. .................. 29/564.6 |
| 4,763,400 | 8/1988 | Deckers ............................ 29/564.6 |

Primary Examiner—William R. Briggs
Attorney, Agent, or Firm—Sughrue, Mion, Zinn, Macpeak & Seas

[57] ABSTRACT

A work table is provided for mounting a PCB substrate. A cutting tool for cutting the PCB substrates a pin dispenser for inserting a pin into a hole formed in the PCB substrate, and a solder applicator for applying solder on the PCB substrate are attached on a work head. X, Y and Z axes driving means are provided for moving the work head in a horizontal direction and in a vertical direction. A control unit responds to data signals for operating the cutting tool, pin dispenser and solder applicator for controlling operations of the X, Y and Z axes driving means, cutting tool, pin dispenser, and solder applicator. Thus, the PCB substrate is made into a printed circuit board.

18 Claims, 14 Drawing Sheets

APPARATUS FOR MANUFACTURING A PRINTED CIRCUIT BOARD

BACKGROUND OF THE INVENTION

The present invention relates to an apparatus for manufacturing a printed circuit board (PCB), and more particularly to an apparatus for forming a circuit pattern and throughholes on a PCB in accordance with data based on a CAD.

There is a case where a small number of PCBs are manufactured for the development of an electronic equipment and the manufacture of a small number of electronic equipments. Even if such a small number of PCB is made, it is desirable to be able to accurately and quickly produce an inexpensive PCB. In such a manufacturing process, optical and chemical processing steps for which a negative for each circuit pattern is required. Since it is necessary to provide the negative even though the number of the PCBs manufactured therewith is small, the manufacturing operation is complicated.

More particularly, in a PCB where circuits are formed on both sides of the substrate thereof, throughholes connecting the both sides are perforated so as to provide a connection between the circuits. Such a PCB with throughholes is also advantageous in that the leads of electronic devices can be passed through the throughholes.

However, the throughholes require complicated processes after the holes are formed, such as plating of the inner surfaces with copper, or filling the holes with silver paste and baking.

In order to simplify the manufacturing process, there has been proposed a print circuit copper laminated board, which is often called a copper film substrate and referred to in the present specification as a PCB substrate, having an insulating substrate on which copper layer is laminated. The PCB substrate is machined to form a desired circuit pattern with a PCB processing machine.

The PCB processing machine has a work table on which the PCB substrate is set, and a work head provided with an X-axis, Y-axis and Z-axis driving devices for moving the work head in the longitudinal, lateral and vertical direction, respectively. The work head has a spindle provided with a chuck on which various cutting tools are attached. An index table is disposed under the=work table for storing the cutting tools and exchanging them when the spindle is lowered.

In a conventional PCB processing machine, a PCB substrate is positioned and fixed on the work table by suction. Thereafter, the portions of the copper conductive film excluding the portion which form the circuit pattern determined in accordance with the CAD data, are removed, holes pierced, and the contour of the board cut out, with respective appropriate cutting tools, in that order.

After the circuit pattern and holes are formed, and the contour shaped, a split pin SP (FIG. 9) is inserted in the hole and soldered to the circuit pattern at the ends, thereby providing conduction as well as fixation there-between. The split pin SP is made of a rectangular resilient metallic plate rolled to form a C in section. The side edges of the plate are cut into waveforms so that a wave-shaped slit S are formed in the pin. The upper and lower end portions are beveled for the ease of insertion. In order to improve the soldering ability and resilience, the split pin SP is made of a copper alloy containing phosphorous and bronze, plated with tin or solder. The outer diameter of the pin is in a range between 0.3 to 2 mm. The length, which depends on the thickness of the PCB substrate, is in a range between 2.5 to 3.5 mm in the case where the thickness of the PCB substrate is 1.6 mm. The thickness of the plate of the split pin SP is usually in the range between 0.1 to 0.15 mm.

These split pins are usually inserted in the holes formed in the PCB substrate with a tapered jig by manual operation, so that the manufacturing efficiency is rather poor. Moreover, the split pin SP is so small that it is difficult to accurately select the pin having the right diameter for each of the holes and to insert the pin a predetermined depth. More particularly, in a PCB where electronic devices are mounted over the pins, the length of the pin and the inserting depth must be carefully chosen so that the operation is further complicated.

Creamlike solder (solder paste) is applied by the upper end of the split pin SP when soldering other devices which are mounted on the PCB substrate. At the lower end, solder is applied by dip soldering. However, when an electronic device is mounted over the pin, it is necessary to solder before mounting by manual operation. In such a case, soldering iron is used in general. Since the split pin is small, it is difficult to apply an appropriate small quantity of solder and heat it with appropriate intensity. For example, the inner space of the split pin may be clogged with excessive solder, so that the advantages of having the throughholes are impaired.

SUMMARY OF THE INVENTION

An object of the present invention is to provide an inserting device for automatically inserting a split pin in an appropriate hole in a PCB substrate at predetermined depth in accordance with CAD data to form a throughhole.

Another object is to provide a soldering device for accurately soldering a conductive member such as a split pin and a circuit pattern where an appropriate quantity of solder is applied and heated at an appropriate intensity at a correct position in accordance with the CAD data.

The above described automatic inserting device, and the soldering device may be stand-alone devices which are operated independently of the PCB processing machine. If both the devices and the processing machine are assembled in one apparatus, some data for the processing machine such as the positions and the diameters of the holes can also be used commonly in both devices. Moreover, the working accuracy can be improved because of the fact that the PCB substrate is machined on same base of a single apparatus.

Therefore a further object of the present invention is to provide an apparatus in which a PCB processing machine, a split pin inserting device and a soldering device are assembled into a single apparatus.

Such an assembled apparatus must be provided with various processing heads for machining the PCB substrate such as a cutter head, split pin inserter head, a solder supply head and a solder heating head. If these heads are assembled in a single head, the weight of the head becomes heavy, thereby causing large inertia. Hence the operational speed and the positioning accuracy are impaired.

Therefore, a still further object of the present invention is to provide an apparatus wherein the heads can be automatically exchanged, thereby quickly and efficiently manufacturing a small number of PCBs having throughholes.

According to the present invention, there is provided an apparatus for manufacturing a printed circuit board, comprising a work table for mounting a PCB substrate, a work head for attaching a cutting tool for cutting the PCB substrate, and a pin dispenser for inserting a pin into a hole formed in the PCB substrate, and a solder applicator for applying solder on the PCB substrate, X, Y and Z axes driving means for moving the work head in a horizontal direction are in a vertical direction.

Data processor means is provided for supplying data signals for operating the cutting tool, pin dispenser and solder applicator. In response to the data signals, a control unit controls operation of the X, Y and Z axes driving means, cutting tool, pin dispenser, and solder applicator, so that the PCB substrate is made into a "printed" circuit board. The apparatus further comprises a heater for heating a drop of solder on the PCB substrate.

The other objects and features of this invention will become understood from the following description with reference to the accompanying drawings.

BRIEF DESCRIPTION OF DRAWINGS

FIG. 1A is a plan view showing a work head;

DETAILED DESCRIPTION OF THE PREFERRED EMBODIMENTS

Figure 1:
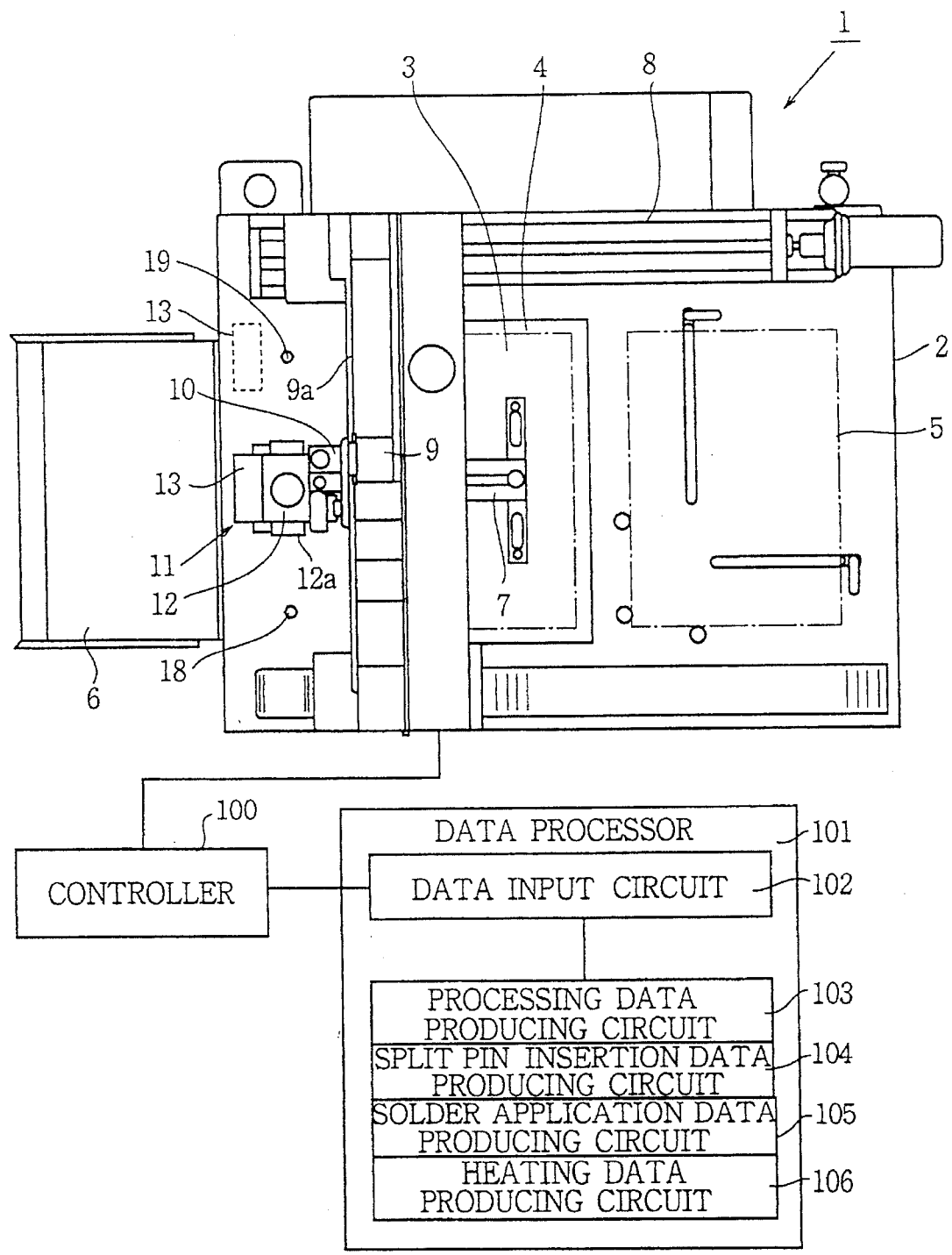
FIG. 1 is an illustration showing a plan view of a processing apparatus for manufacturing a PCB and a block diagram of a control system thereof according to the present invention.
Figure 1:
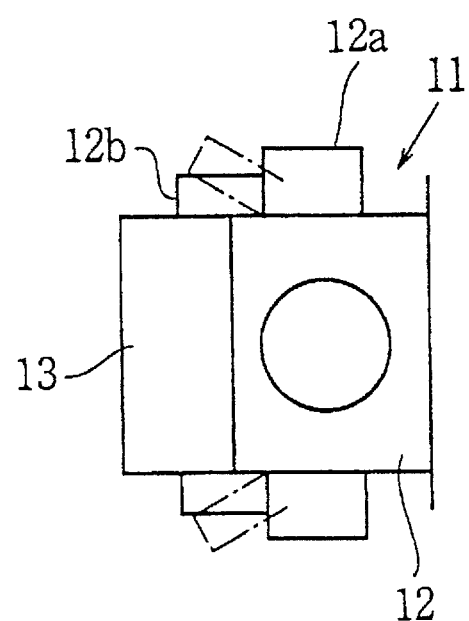
Figure 2:
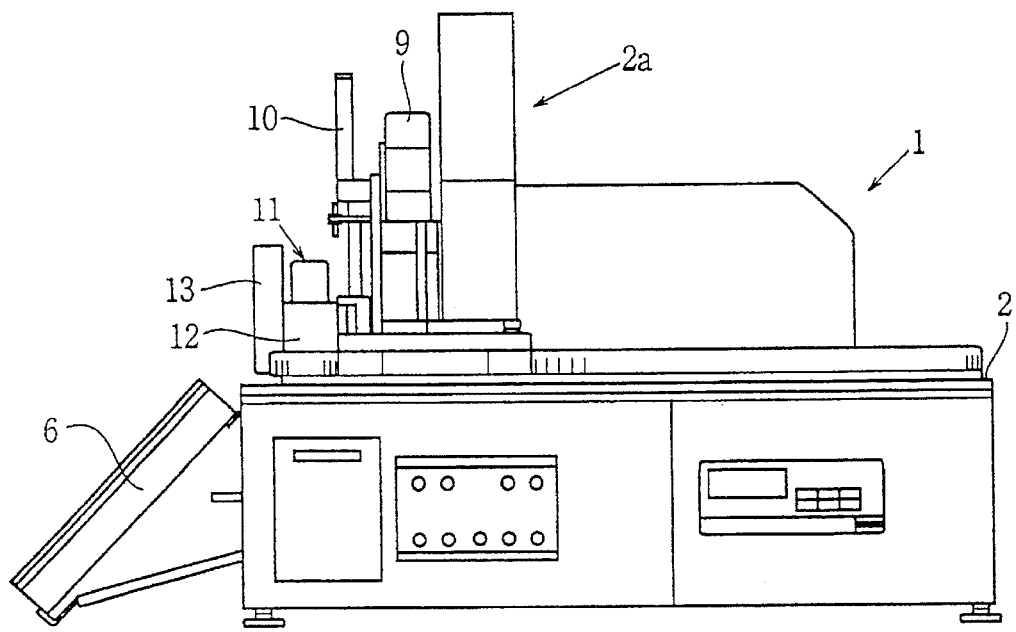
FIG. 2 is an elevational view of the apparatus shown in FIG. 1.

Referring to FIGS. 1 and 2, a processing apparatus 1 is provided for processing a copper laminated substrate 3 to form a PCB. The processing apparatus 1 comprises a table 2, and a processing device 2a. On the table 2 are provided a PCB setting section 5 where PCB substrates 3 which are to be processed are set, and a work table 4 adjacent the setting section 5 where PCB substrate 3 is adhered by suction at a predetermined position and then processed. A PCB receiver 6 is provided at a side of the apparatus opposite the setting section 5 to receive the processed PCBs. A carrier 7 carries the PCB substrate 3 from the setting section 5 to the work table 4 and further to the PCB receiver 6.

The processing device 2a has an X-axis driving device 8 extending along a longitudinal side of the table 2 for moving a cross rail 9a in the X-axis, or longitudinal direction of the apparatus 1, and a Y-axis driving device 9 slidably mounted on the cross rail 9a to move in the Y-axis, that is the laternal direction of the apparatus 1. Perpendicularly attached on the side of the Y-axis driving device 9 is a Z-axis driving device 10. A work head 11 which performs various processing operations on the PCB substrate 3 such as carving unnecessary conductive copper layer, perforating holes and shaping the contour of the PCB is attached on the Z-axis driving device 10 through a head base 12 thereof. Hence, the work head 11 can be horizontally and vertically moved in any direction, for forming throughholes in the PCB substrate 3, which will be later described in detail. A detachable multiple tool unit 13 is attached to the head base 12. More particularly, as shown in FIG. 1A, a clamp device 12a is provided on each of the opposite sides of the head base 12. The clamp device 12a has a clamp arm 12b which is pivotable as shown by a dot-dash line. The multiple tool unit 13 is attached to the base 12 by clamp arms 12b of the clamp devices 12a. The detached multiple tool unit 13 is mounted on the table 2 at a position shown by a dotted line in FIG. 1.

Figure 3:
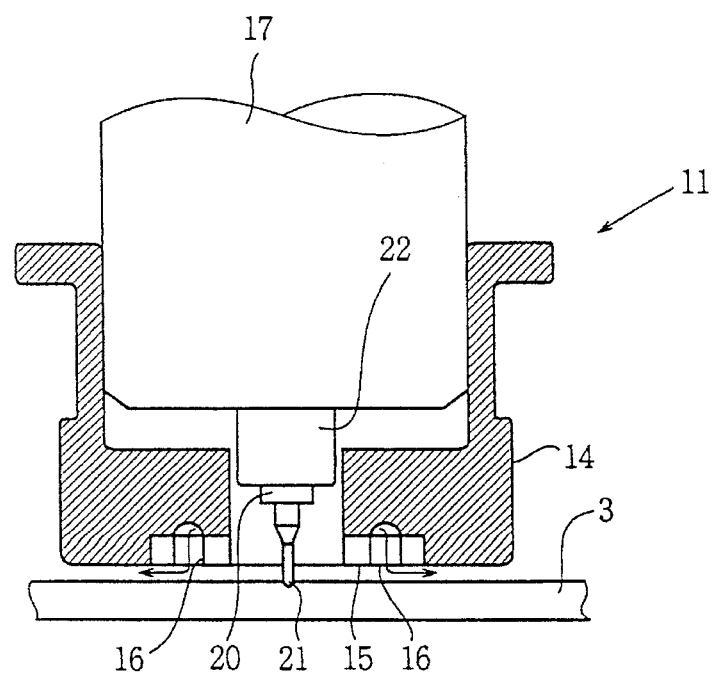
FIG. 3 is a sectional view showing an end portion of a work head provided in the apparatus.

Referring to FIG. 3 showing a lower portion of the work head 11 in detail, attached to the bottom of the head base 12 is a motor 17 having a spindle 22 on which a chuck 20 for holding a detachable cutting tool 21 is provided. A cover 14 is slidably attached to the motor 17 to cover the motor 17, spindle 22 and the chuck 20 while allowing the tip end of the cutting tool 21 to protrude from a bottom 15 of the cover 14. The position of cover 14 relative to the motor 17 is adjusted by moving the cover 14 by a step motor (not shown), so that the projecting quantity of the cutting tool 21 from the cover 14 is adjusted.

A plurality of air ejection holes 16 are formed on the bottom 15 of the cover 14. In operation, an air layer is formed between the bottom 15 and the PCB substrate 3 so that air flows through the ejection holes 16, thereby floating the cover 14, and hence the head 11. Thus, by adjusting the thickness of the air layer, the cutting depth by the cutting tool 21 is adjusted. The tip angle of the cutting tool 21 is 90 degrees. Therefor, by changing the cutting depth, the diameter of the hole cut by the tool 21 can be changed.

Referring back to FIG. 1, a linear gauge 18 is provided adjacent the head base 12 between the work table 4 and the PCB receiver 6. The linear gauge 18 detects the vertical positions of the bottom 15 of the cover 14, tip end of the cutting tool 21 and of various tools provided in the multiple tool unit 13 so as to control the position of head base 12. The processing apparatus 1 is further provided with a means for automatically exchanging the cutting tools. A tool drawing chuck 19, which is provided adjacent the work head 11, firmly grips the cutting tool 21 and releases it from the chuck 20, at the end of the processing operation. The cutting tool 21 is carried to a tool storage (not shown) provided under the table 2 where other cutting tools are stored.

Figure 4:
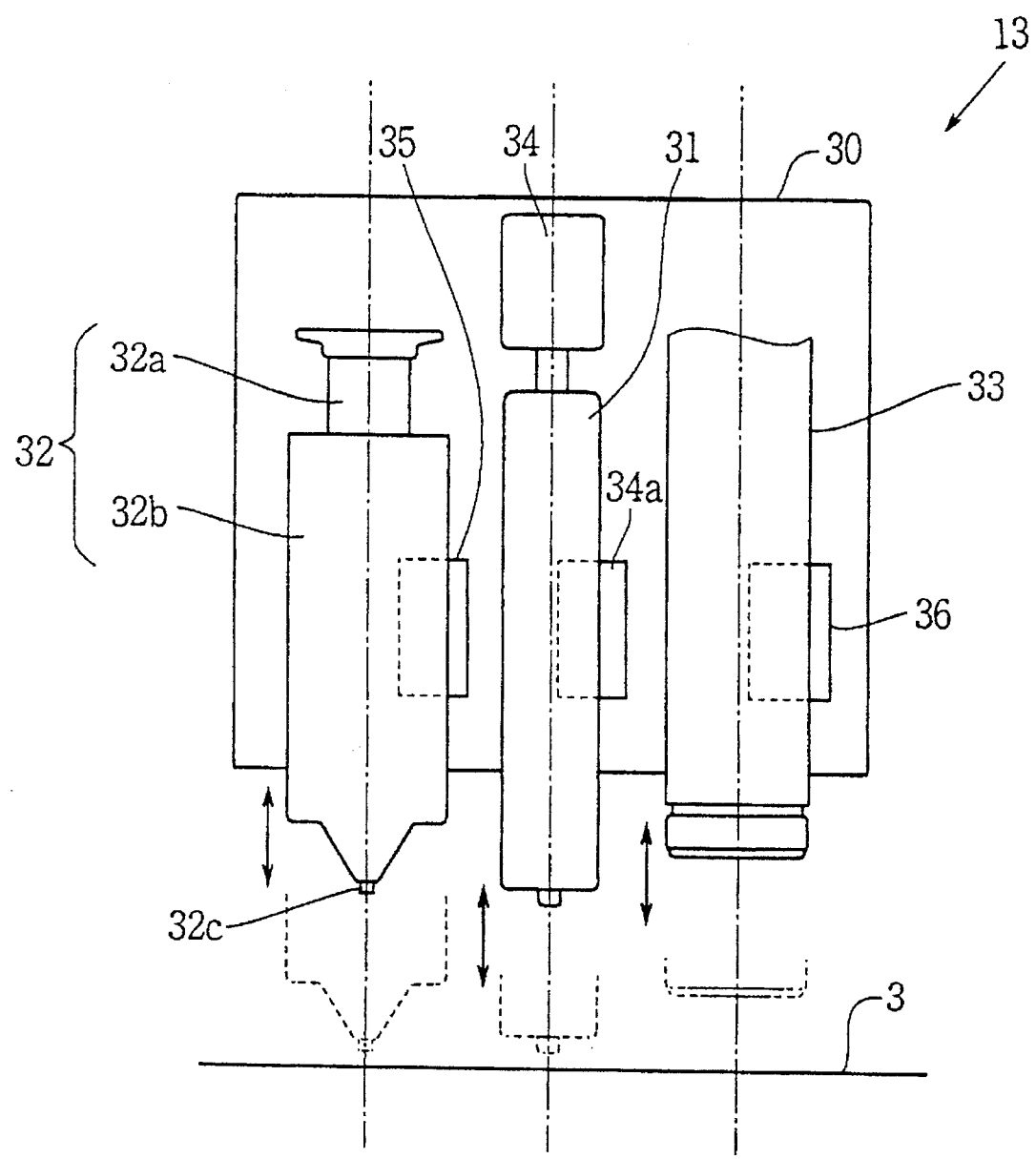
FIG. 4 is a schematic elevational view of a multiple tool unit provided in the apparatus.
Figure 9:
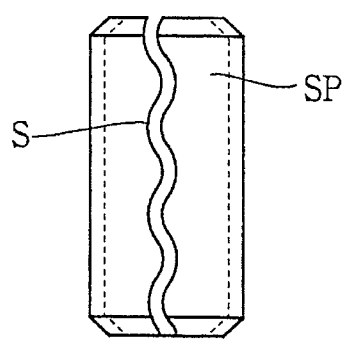
FIG. 9 is a side elevational view of a split pin used for forming a throughhole in the PCB.
Figure 10:
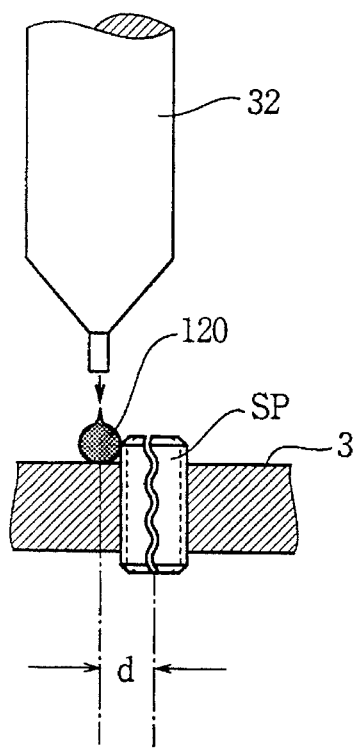
FIG. 10a is an illustration describing the operation of a solder applicator provided in the apparatus of the present invention.
FIG. 10b is an illustration describing the operation of a heater provided in the apparatus of the present invention.
Figure 10:
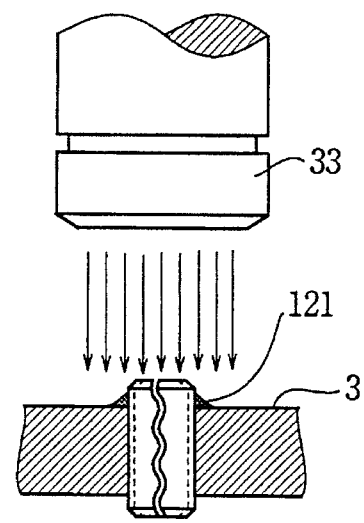
Figure 11:
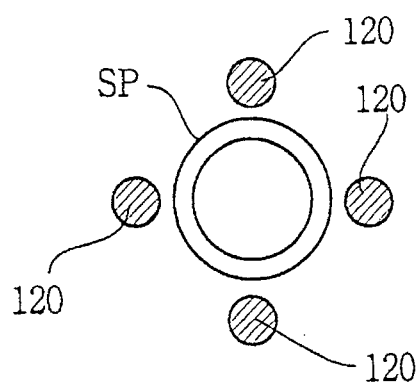
FIGS. 11a and 11b are illustrations showing examples of solder applicating patterns.
Figure 11:
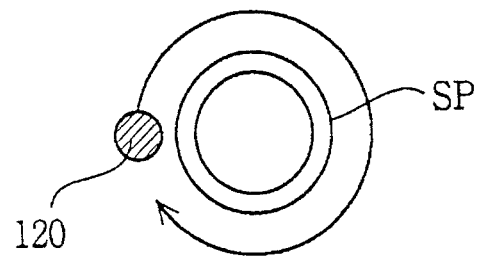
Figure 12:
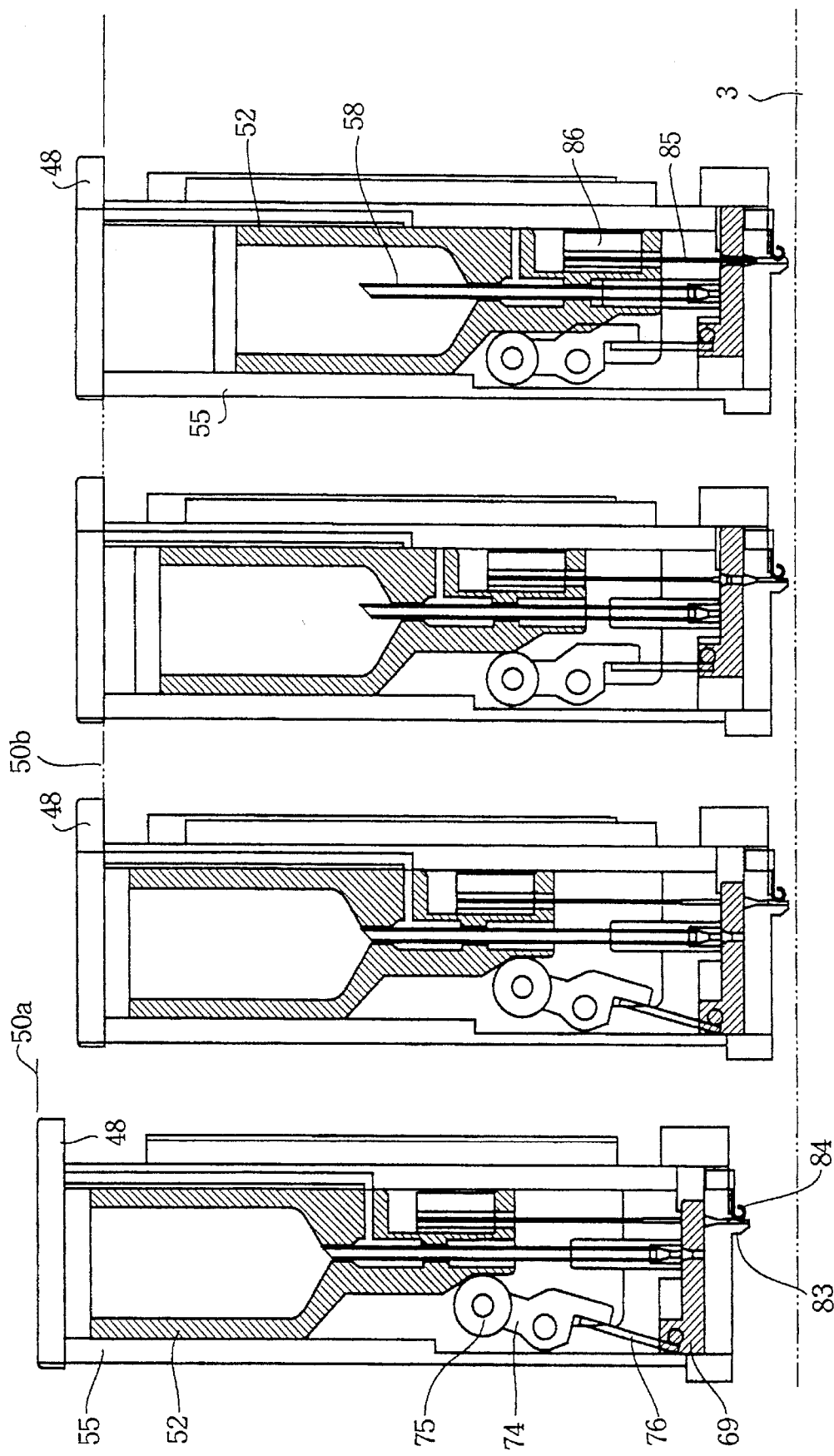
FIGS. 12a to 12d are sectional views of the split pin dispenser during the operation thereof.
Figure 13:
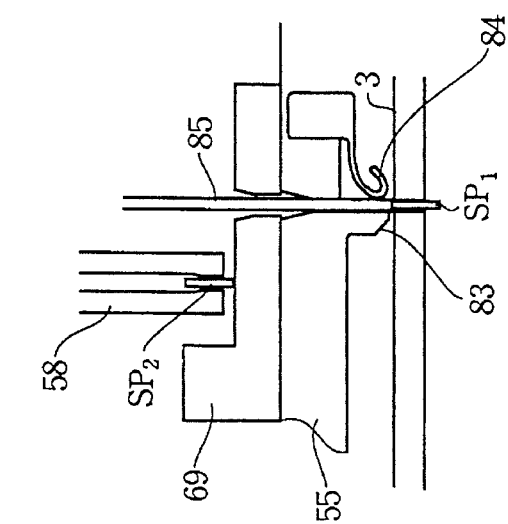
FIGS. 13a to 13c are enlarged views of parts of FIGS. 12b to 12d,respectively.
Figure 13:
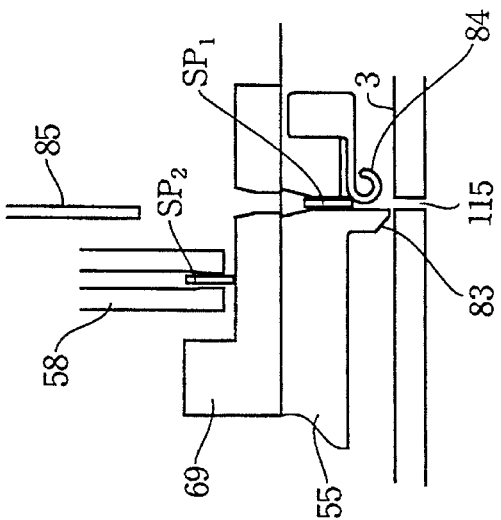
Figure 13:
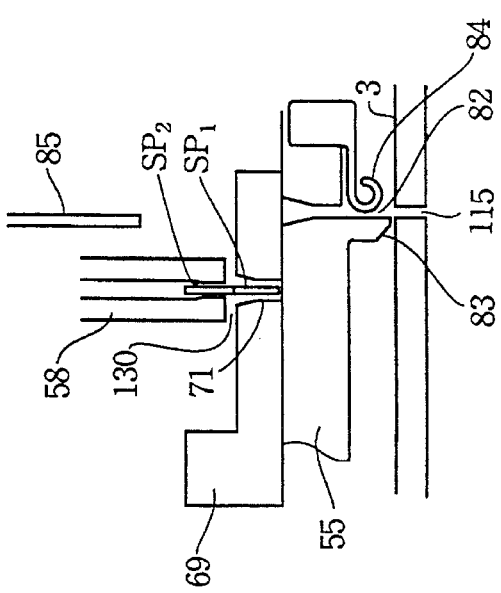

Referring to FIG. 4, the multiple tool unit 13 has a panel 30 which is adapted to be attached to a front side of the head base 12 by the clamp arms 12b, as described above. A plurality of tools are mounted on the panel 30. Namely, there is provided a split pin dispenser 31 for inserting the split pin SP shown in FIG. 9 into a hole formed in the PCB substrate 3, solder applicator 32 for applying solder around the split pin SP, and a heater 33 for melting the applied solder. The split pin dispenser 31, solder applicator 32 and the heater 33 are provided with respective elevators 34a, 35 and 36, so as to be lowered to positions shown by dotted lines during operation.

When attached to the head base 12, the multiple tool unit 13 is electrically connected to the work head 11 thorough electric connectors and couplers which are provided on the panel 30 and at corresponding positions of the head base 12. Thus, the tools are fed with necessary electricity, air and control signals, and the detection signals from various sensors provided in the tool unit 13 are fed to a control system of the apparatus 1.

Figure 5:
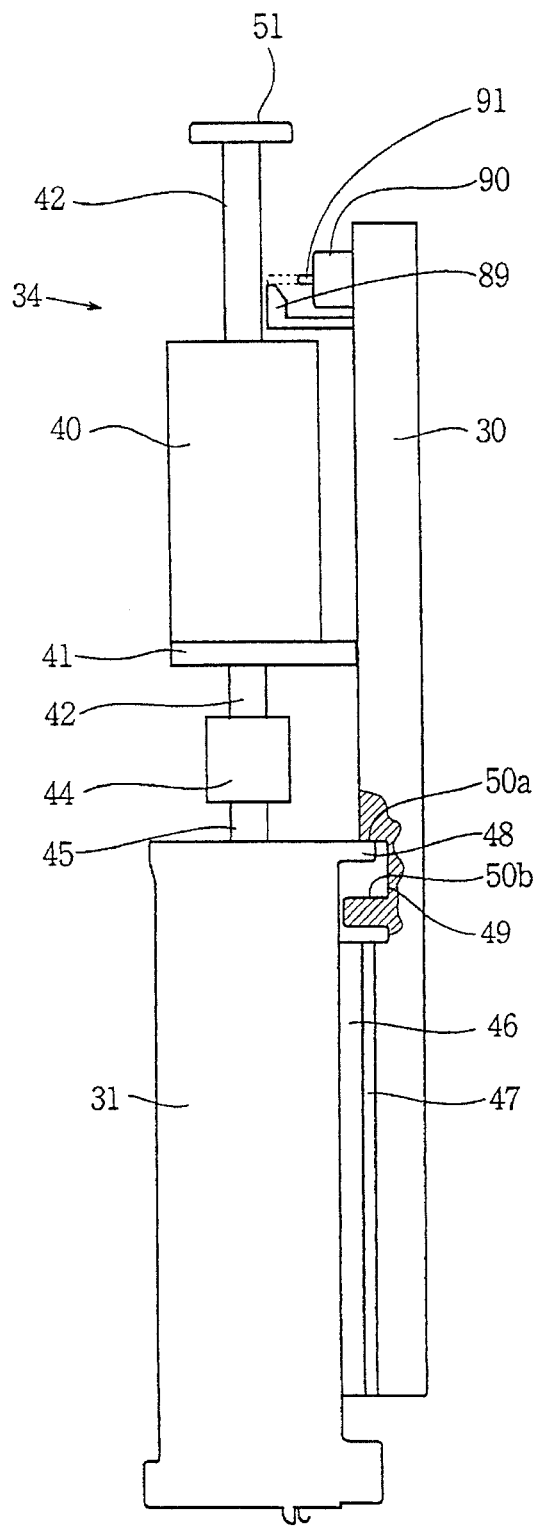
FIG. 5 is an elevational view of a split pin dispenser and an actuator thereof provided in the multiple tool unit of FIG. 4.

Referring to FIG. 5, the split pin dispenser 31 has a housing 55 (FIG. 6) vertically and slidably mounted on projections 46 and 47 formed on the panel 30 so as to be elevated and lowered when the elevator 34a is operated. A stopper 48 is provided, integral with the upper portion of the housing 55, and inserted in a recess 49 formed in the panel 30 for defining the upper and lower limits of the moving rage of the housing 55. Namely, the stopper 48 abuts against an upper inner surface 50a of the recess 49 at an initial position. When the housing 55 is lowered to the position shown by the dotted line in FIG. 4, the stopper 48 rests on a lower inner surface 50b of the recess 49, thereby preventing the housing 55 to slide further downward.

The split pin dispenser 31 is provided with an actuator 34 disposed above the housing 55. The actuator 34 comprises as a power source, a cylinder 40 mounted on a plate 41 fixedly attached on the panel 30. A shaft 42 having a stopper 51 at an upper end thereof penetrates through the cylinder 40 and is further connected to a connecting shaft 45 through a ball joint 44. The connecting shaft 45 is adapted to reciprocate in the housing 55 in accordance with the operation of the cylinder 40 and the shaft 42. The ball joint 44 absorbs bending stress between the shafts 42 and 45.

A stopper 89 projects from the panel 30 at an upper portion thereof so as to engage with the stopper 51 of the shaft 42 when lowered. Above the stopper 89 is provided a cylinder 90 which operates a retractable spacer 91. The spacer 91 projected as shown by a dotted line, serves to increase the height of the stopper 89, thus restricting the downward movement of the shaft 42 and hence the connecting shaft 45. Thus, the inserting depth of the split pins SP can be adjusted.

Figure 6:
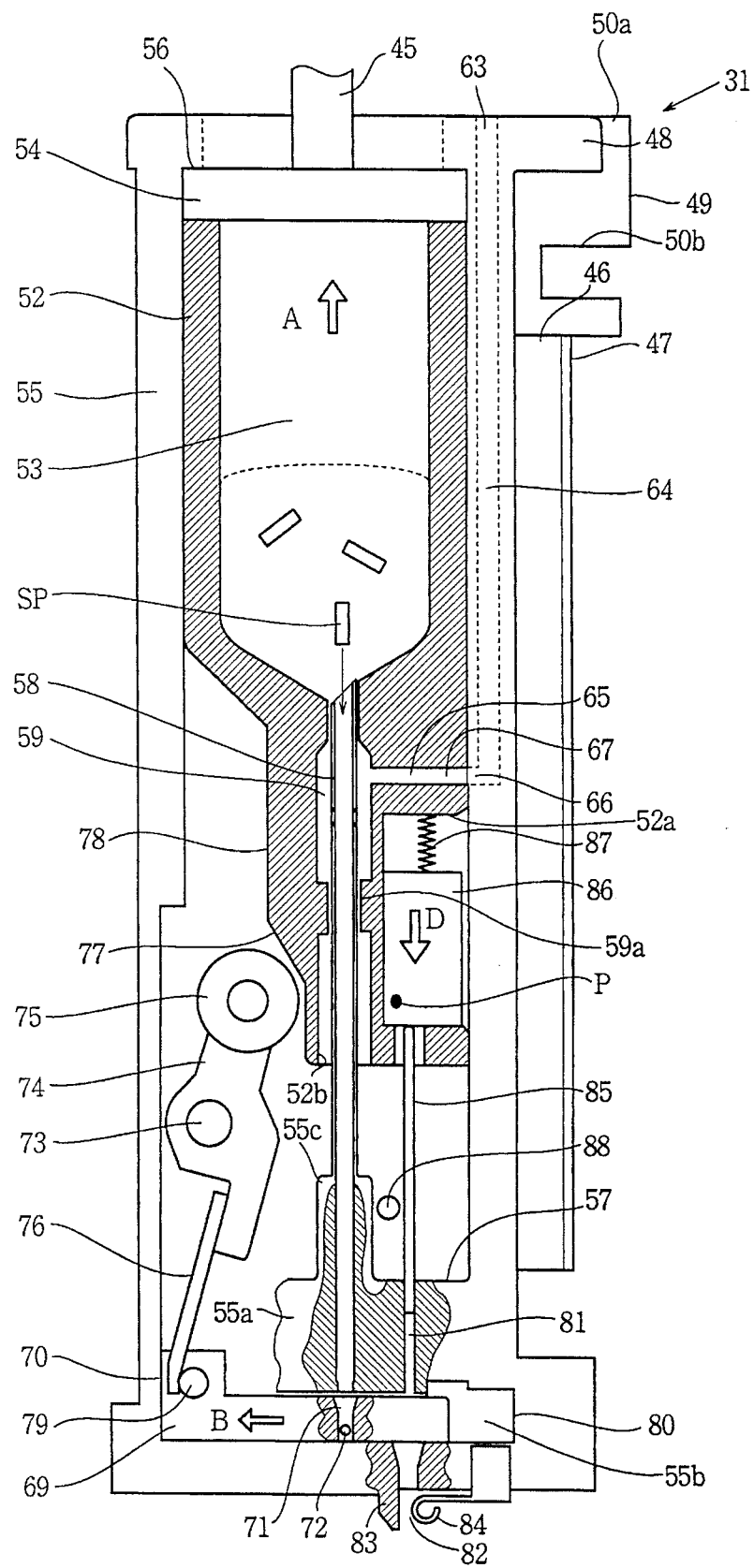
FIG. 6 is a sectional view of the split pin dispenser shown in FIG. 5.

Referring to FIG. 6 showing the split pin dispenser 31 in detail, a hollow body 52 having an inner chamber 53 shaped like a funnel and storing a plurality of split pins SP is vertically slidably mounted in the housing 55. A lid 54 attached to the lower end of the connecting shaft 45 is fixedly mounted on the body 52 at the upper portion thereof. A recess 52a confronting the inner periphery of the housing 55 is formed at a lower potion of the body 52.

The chamber 53 in the body 52 is communicated with an intermediate cavity 59 formed in the housing 55 under the chamber 53. The cavity 59 is communicated with a bottom recess 52b formed on the bottom of the body 52 through a passage 59a. The cavity 59 is communicated with ambient air through an air passage 65 horizontally formed in the body 52, an opening 67 thereof, an air passage 64 vertically formed in the housing 55 and having a lower opening 66 opposing the opening 67 when the body 52 is at the uppermost position in the initial stage, and an upper opening 63 on the surface of the housing 55.

A base 55a is provided in the housing 55 projecting from the inner wall thereof, thereby forming a space 55b between the base 55a and the bottom of the housing 55. Integrally attached on the base 55a is a projection 55c on which a pipe 58 is secured. The pipe 58 is upwardly extended penetrating through the recess 52b, passage 59a, and the cavity 59 to protrude into the chamber 53 of the body 52. The upper end of the pipe 58 is diagonally cut to facilitate the entrance of the split pins SP therein.

The body 52 is urged in a direction shown by an arrow A by a spring (not shown), so that the lid 54 normally abuts against the upper inner wall 56 of the housing 55. In operation, the body 52 is operated to reciprocate in a space defined by the upper wall 56 and an upper surface 57 of the base 55a. When the body 52 is at the lowest position, the stopper 51 of the actuator 34 engages the stopper 89.

Figure 7:
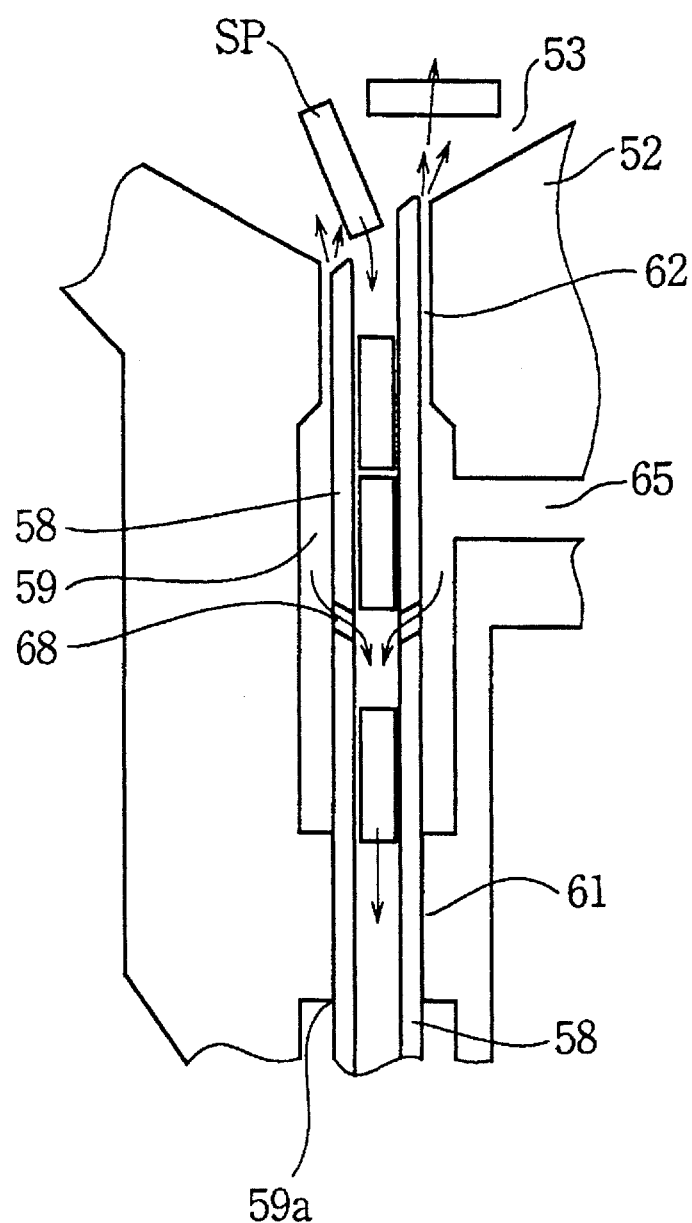
FIG. 7 is an enlarged view showing a part of the dispenser.
Figure 8:
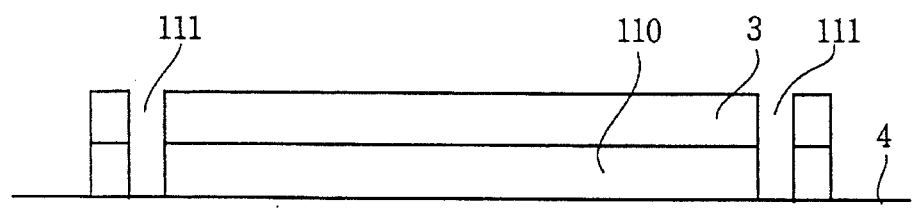
FIGS. 8a to 8d are sectional views describing the operation of the processing apparatus for forming a PCB.
Figure 8:
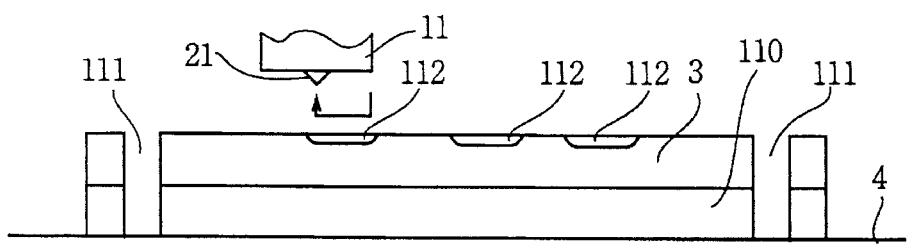
Figure 8:
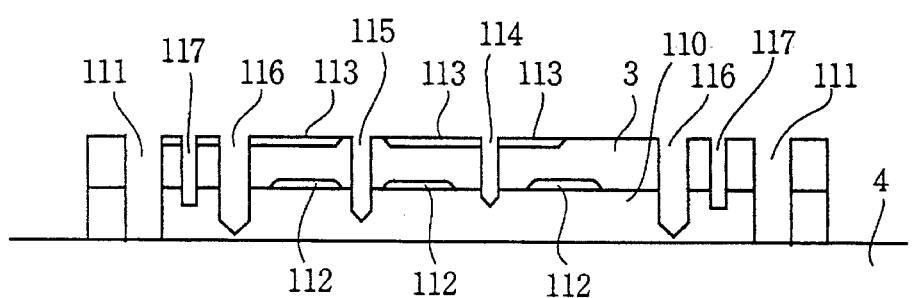
Figure 8:
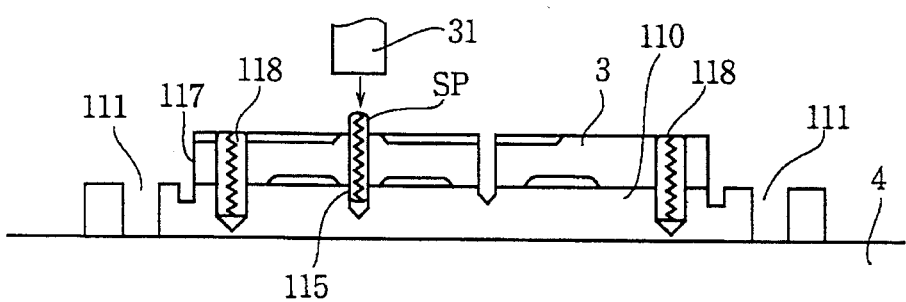

As shown in FIG. 7, a packing 61 is provided between the pipe 58 and the inner wall of the passage 59a, thereby hermetically sealing the recess 59. Thus, the ambient air applied through the air passage 65 is ejected into the inner space 53 through a gap 62 formed between the pipe 58 and the body 52, thereby aiding the split pins SP detained at the bottom of the chamber 53 to float up and to enter the pipe 58 as they fall down. A pair of opposite holes 68 slanting inward is formed in the pipe 58, hence allowing the ambient air in the cavity 59 to flow downwardly through the pipe 58, so as to enhance the downward movement of the split pins SP.

Referring back to FIG. 6 there is provided a block 69 which slides in the space 55b defined by right inner wall 80 and a left inner wall 70 of the housing 55. The block 69 is urged in a direction shown by an arrow B by a spring (not shown). The block 69 has a pin 79 provided at the left side thereof. The pin 79 is engaged with a resilient rod 76 which is attached to an end of a lever 74 pivotally mounted in the housing 55 on a shaft 73. The other end of the lever 74 has a circular cam follower 75. When the body 52 is lowered, the cam follower 75 abuts on a slant portion 77 and a vertical portion 78 of the body 53, which serve as a cam. Namely, as the cam follower 75 rolls on the slant portion 77 and the vertical portion 78, the lever 74 rotates in the counterclockwise direction. The resilient rod 76 accordingly pushes the pin 79, and hence the block 69 in the direction opposite to the direction B until the block 69 is against the wall 80 of the housing 55.

Formed in the block 69 is a transporting hole 71 which is adapted to be positioned directly under the pipe 58 when the block 69 is at the initial left end position. A horizontal hole 72 which perpendicularly crosses the hole 71 extends laterally, penetrating the block 69 and the housing 55. In the hole 72 a parts sensor comprising an optical sensor is provided to detect a split pin in the transporting hole 71.

In the recess 52a of the body 52, a block 86 which supports a downwardly extending push rod 85 is slidably provided. The block 86 is urged by a spring 87 in a direction shown by an arrow D. A rod guide hole 81 is formed in the base 55a penetrating through the entire thickness thereof at a position adapted to align with the transporting hole 71 of the block 69 when the block 69 is at the right end position.

On the bottom of the housing 55, a split pin guide hole 82 is formed directly under the rod guide hole 81. A downwardly protruding semicircular guide 83 having a vertical groove on the inner surface thereof is formed adjacent the hole 81. A holding spring 84 is provided to confront the inner groove of the guide 83 so as to press the split pin SP against the groove, thereby holding the split pin SP for positioning.

When the block 86 is lowered together with the body 52, the push rod 85 is inserted in the guide hole 81, thereby pushing the split pin SP in the transporting hole 71 down into the guide hole 82. An excessive load sensor 88 such as an optical sensor is provided adjacent the base 55a to detect a point P of the block 86 when the block is lowered. If the guide hole 82 is clogged with the split pins, the push rod 85 cannot completely enter the rod guide hole 81. Hence the block 86 slightly floats against the urging of the spring 87, the force of which is somewhat larger than the normal force exerted to insert a split pin SP into the guide hole 82. Thus the sensor 88 cannot detect the point P on the block 86, thereby enabling to detect the abnormality of the device.

Referring back to FIG. 4, the solder applicator 32 is a syringe comprising a barrel 32b containing solder, and a pneumatically operated plunger 32a. The barrel 32b has a nozzle 32c at a lower end thereof. When pressurized air is applied for a predetermined length of time, the plunger 32a is pushed into the barrel 32b, so that a predetermined quantity of solder in the barrel 32b is discharged through the nozzle 32c. A temperature regulator is provided in the barrel 32b so as to maintain the temperature of the solder constant, thereby stabilizing the viscosity of the solder.

The heater 33 has a light source such as a halogen lamp and a laser source, and a reflector or a lens for focusing the light emitted from the source. Although the diameter of a beam spot of the emitted light may be fixed if the range of the diameters of the split pins to be soldered is small, it is preferable to adjusted the diameter in accordance with the diameters of the split pins. Adjustment of the beam spot is realized either by adjusting the lens in order to change the focus, operating the elevator 36, or by adjusting the aperture of the heater 33. As another example of the heater 33, a hot blast heater may be used.

As shown in FIG. 1, the control system of the processing apparatus 1 has a controller 100 for controlling the operations of the X-, Y- and Z-axes driving devices 8, 9 and 10, work head 11, the attaching and detaching operations of the multiple tool unit 13, and the operations of each of the tools provided in the tool unit 13. The controller 100 is applied with data signals from a data processor 101. The data processor 101 comprises a data input circuit 102 for inputting data such as a CAD data of a PCB design, that is circuit patterns and positions of holes to be formed in the PCB substrate 3. The input data are applied to a processing data producing circuit 103 which produces data for cutting the PCB substrate 3 to form circuit patterns, holes and the contour of a PCB, a split pin inserting data producing circuit 104 which produces data for inserting split pins in the cut holes to form throughholes, solder application data producing circuit 105 for applying a predetermined quantity of creamlike solder to the split pins, and a heating data producing circuit 106 for heating and melting the applied solder.

The operation of the processing apparatus 1 is described hereinafter with reference to FIGS. 8 to 13.

The PCB substrate 3 to be processed is reversed and temporarily adhered on a substrate sheet 110 beforehand (FIG. 8a). The substrate sheet 110 protects the work table 4 which holds the substrate 3 from damage when the cutting tools cut through the substrate. The adhesive means is preferably a double-sided adhesive tape, used for adhering the sheet 110, so that the sheet 110 can be easily taken off after the operation.

Positioning holes 111 are perforated through the substrate 3 and the substrate sheet 110. The substrate 3 together with the substrate sheet 110 is then set on the PCB substrate setting section 5 and transported by the carrier onto the work table 4.

In the cutting operation with the work head 11, the multiple tool unit 13 is removed from the head 11. More particularly, the work head 11 is located at the position shown in FIG. 1 and moved in the Y-axis direction to the position shown by the dotted line for the unit 13 by the Y-axis driving device 9. Thereafter, the head is lowered to mount the unit 13 on the table 2 by the Z-axis driving device 10, and the clamp arms 12b of the clamp devices 12a are removed from the unit 13 as shown by dot-dash lines in FIG. 1A. Thus, the unit 13 is put on the table and positioned by positioning means (not shown) at a predetermined position as shown by the dotted line in FIG. 1.

Referring to FIG. 8a, the substrate 3 is positioned on the work table 4 with positioning pins inserted in the positioning holes 111 and adhered thereon by a suction means. The positioning pins are sufficiently buried in the holes so as not to interfere the movements of the work head 11 during the operation.

Referring to FIG. 8b, at the next step, machining of the underside of the substrate 3 is carried out with the cutting tool 21 attached to the work head 11. Since the multiple tool unit 13 is kept detached from the work head 11, the load on the head 11 is reduced enough to accurately and quickly machine the substrate 3. More particularly, as shown by an arrow in FIG. 8b, the X-, Y- and Z- axes driving devices 8, 9 and 10 are operated to move the cutting tool 21. The cutting tool 21 accordingly cuts away unnecessary portions of the copper layer on the surface of the PCB substrate 3, thereby forming grooves 112.

The PCB substrate 3 and the substrate sheet 110 are then dismounted from the processing apparatus 1. The substrate 3 is detached from the sheet 110, reversed, and again adhered on the sheet 110, coinciding the positioning holes 111. The PCB substrate 3 and the substrate sheet 110 are again set on the work table 4 so as to machine the other side of the substrate 3 and to form holes as shown in FIG. 8c. Namely, unnecessary portions of the copper layer on the upper surface of the PCB substrate 3 are cut away to form grooves 113 and holes 114, 115, 116 and 117 are perforated. The holes 115 are provided for receiving split pins SP to form throughholes. In the holes 116, positioning split pins 118 (FIG. 8d) are inserted to keep the substrate 3 and the sheet 110. Outside parts of the holes 117 are cut away to form edges of the PCB substrate 3 as shown in FIG. 8d.

Thereafter, the controller 100 is operated to attach the multiple tool unit 13 on the head base 12 of the work bead 11 for inserting and soldering the split pins SP.

Describing the operation of the split pin dispenser 31 in detail, the data on the positions of the holes 115, that is the X and Y coordinates, inserting depth of the split pins SP, and the lengths of the split pins SP projecting out of the upper and lower surfaces of the PCB substrate 3, are derived from the split pin inserting data producing circuit 104.

Referring to FIG. 12a, at the initial position of the split pin dispenser 31, the stopper 48 of the housing 55 abuts on the upper wall 50a of the recess 49 formed in the panel 30. The relative position of the body 52 to the housing 55 is the same as that shown in FIG. 6. The guide 83 at the bottom end of the housing 55 is at a predetermined height.

The elevator 43a is operated to lower the housing 55 6 mm to the lowermost position shown in FIG. 12b where the stopper 48 abuts on the lower wall 50a of the recess 49. The body 52 retains the position shown in FIG. 6 with respect to the housing 55.

The split pins SP in the chamber 53 are led into the pipe 58 and lined therein. As shown in FIG. 13a, only one split pin SP1 is inserted in the transporting hole 71 while another split pin SP2 next to the split pin SP1 stays in the pipe 58. Taking the manufacture tolerance regarding the length of the split pins SP into consideration, the thickness of the block 69 is designed to coincide with the minimum length. A gap 130 formed between the pipe 58 and the block 69 corresponds to the range of the tolerance. Thus, as long as the split pin SP is within the range of the manufacturing tolerance, each split pin is ejected one by one.

Referring to FIG. 12c, the controller 100 operates the actuator 34 to push down the shaft 42 and hence the connecting shaft 45 6 mm. Therefore, the body 52 in the housing 55 descends to a position 12 mm lower than the initial position of FIG. 12a. The slant portion 77 of the body 52 urges the lever 74 to rotate in the couterclockwise direction so that the block 69 in the space 55b is pushed by the rod 79 to the right end position, thereby aligning the transporting hole 71 with the guide holes 81 and 82. As a result, the split pin SP1 drops into the hole 82 and is held therein by the holding spring 84 as shown in FIG. 13b.

The shaft 42 of the actuator 43 is further depressed until the stopper 51 thereof engages with the stopper 89. The body 52 is positioned as shown in FIG. 12d where the bottom recess 52b is engaged with the projection 55c of the base 55a. That is to say, the shaft 42 is lowered 10.5 mm from the position shown in FIG. 12c so that the body 52 is lowered 22.5 mm in all from the initial position. The block 86 in the recess 52a of the body 52a of the body 52 is also lowered so that the push rod 84 is thrust into the transporting hole 71 and the guide hole 82. Consequently, the split pin SP1 in the guide hole 82 yields the holding spring 84 downward to increase the space between the spring 84 and the guide 83. Hence the split pin SP1 is inserted in the hole 115 of the substrate 3. In order to decrease the inserting depth of the split pin SP, the space 91 is projected out of the cylinder 90 as shown in FIG. 5.

Thereafter, the shaft 42 is retracted upward so that the body 52 is lifted by the urging of the spring. When the body 52 is 6 mm lower than the initial position, as shown in FIG. 12b, the block 69 returns to the position where the transporting hole 71 is under the piper 58. Hence, the next split pin SP2 drops into the transporting hole 71, and the operations described in FIGS. 12c and 12d are repeated. Namely, with each stroke of the shaft 42, one split pin is dispensed and inserted in one of the holes 115. The X- and Y-axes driving devices 8 and 9 moves the head base 12 to place the guide 83 of the split pin dispenser 31 above each of the holes 115 during the operation.

FIG. 8d shows the PCB substrate 3 wherein the split pins SP and 118 inserted in the holes 115 and 116 in the manner described above. After the split pins SP are inserted, the split pin dispenser 31 is raised by the elevator 34a to the initial position.

In accordance with the data fed from the solder application data producing circuit 105, the controller 100 operates the X- and Y-axes driving devices 8 and 9 to move the work head 11 to a designated solder applying positions determined by X and Y coordinates. That is to say, the solder application data producing circuit 105 selects holes 115 which are to be formed into throughholes and the diameters of the holes 115 are determined in accordance with the PCB design data. Thus a point or a trail on which the solder is to be applied is determined.

The elevator 35 lowers the solder applicator 32 and the plunger 32a is pneumatically operated to apply a drop of creamlike solder 120 as shown in FIG. 10a adjacent the inserted split pin SP.

The controller 100 derives data from the heating data producing circuit 106 to determine heating positions. Namely, the data on positions, that is, the X and Y coordinates of throughholes are selected from the PCB design data. The X- and Y-axes driving devices 8 and 9 are accordingly operated to position the work head 11. The heater 33 is then lowered by the elevator 36 as shown in FIG. 10b to melt the solder 120. As a result, a fillet 121 is formed along the juncture between the split pin SP and the substrate 3, thereby soldering the split pin SP. When the diameter of the split pin SP is small, the solder need to be applied at only one point around the pin, because, due to the capillarity, the molten solder 120 is spread along the entire periphery of the split pin SP. The heater 33 is preferably adjusted to form a circular beam covering the entire range of the spread solder 120 so as to equally heat the split pins SP, copper land and the solder 120.

In the case of a larger split pin, the quantity of air applied to operate the plunger 32a of the solder applicator 32 is increased to increase the quantity of the solder applied at one point. More preferably, the solder 120 is applied at several points surrounding the split pin SP as shown in FIG. 11a. Although it takes more time for the applicator 32 to be lifted, moved to a point of predetermined coordinates and lowered again, it is preferable for forming a uniform fillet 121.

In order to reduce the applying time, an applicator having a plurality of nozzles is used. Moreover, by enabling to change the interval between each nozzle, the applicator can be readily used for split pins of various sizes.

In another example shown in FIG. 11b, the applicator with a single nozzle is used to apply solder continually around the split pin SP. Although it may take more time, it is advantageous in that only one type of nozzle is needed. The heater 33 is set to apply heat for a constant time sufficient to melt the solder on the largest split pins provided. However, smaller pins may be excessively heated. Thus it is preferable to control the heating time in accordance with the diameter of the split pin. The heating time may be further controlled dependent on the size of the area of the copper circuit pattern even among the split pins having the same diameter. Namely, since the heat radiation is increased as the circuit pattern is spread wider, heating time appropriate for PCB substrate with the compact circuit pattern may not be sufficient for the substrate with a wider circuit pattern. Thus, the heating time is controlled in accordance with the range of the circuit pattern detected from the PCB design data.

Figure 14:
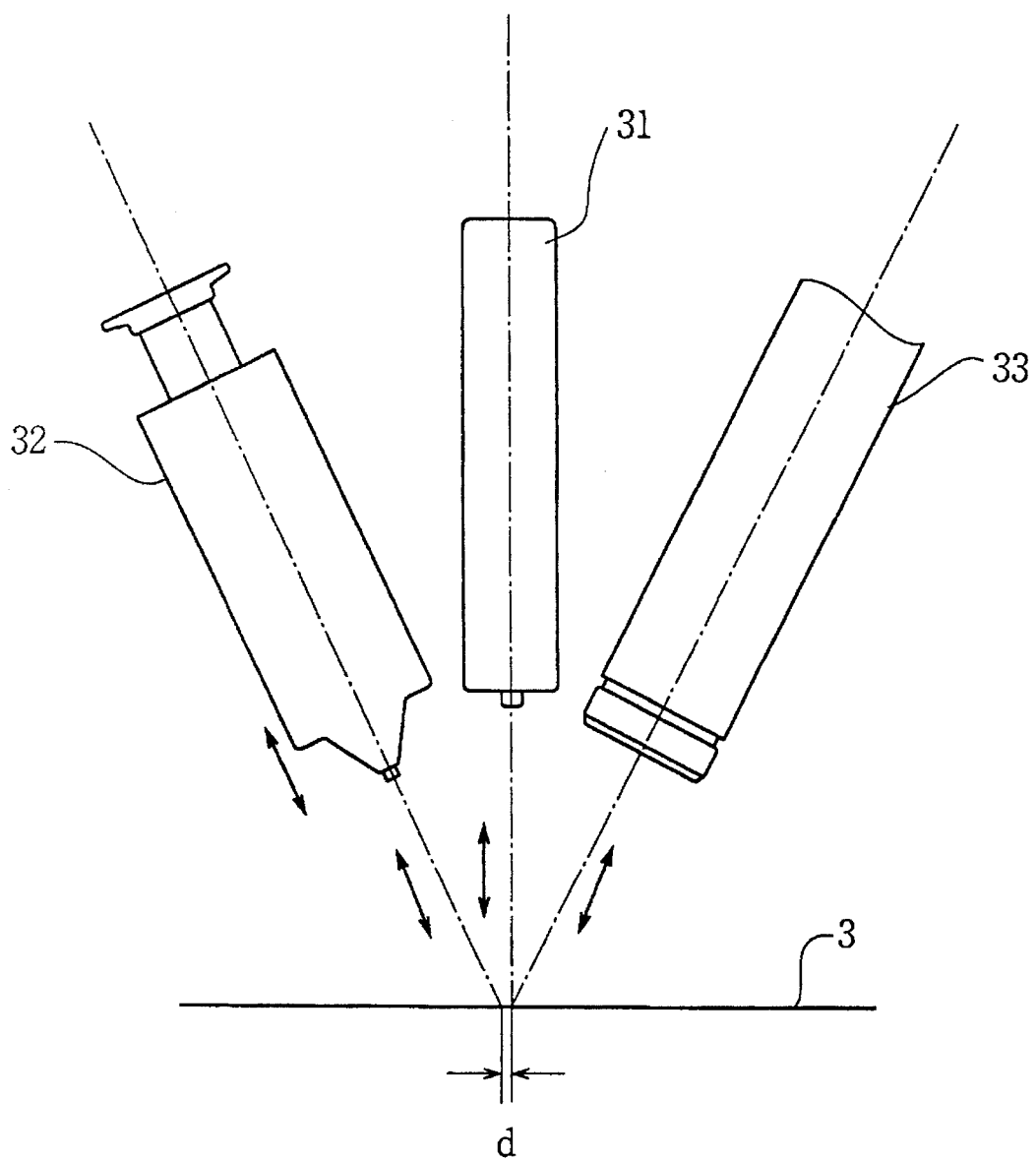
FIG. 14 is a schematic diagram showing a modification of the multiple tool unit.

FIG. 14 shows a modification of the multiple tool unit 13 of the present invention. Whereas the split pin dispenser 31, which involves vertical movement is disposed perpendicular to the PCB substrate 3 at the center of the panel 30, the solder applicator 32 and the heater 33 are disposed on either side of the dispenser 31 inclined thereto at the lower end. The split pin dispenser 31 and the heater 33 are pointed toward one point on the PCB substrate 3, and the solder applicator 32 is adapted to apply the solder to be deflected d from the point. Hence the insertion of the split pins SP, application of the solder and the heating can be serially carried out without moving the work head 11 in the X-axis and Y-axis directions.

Figure 15:
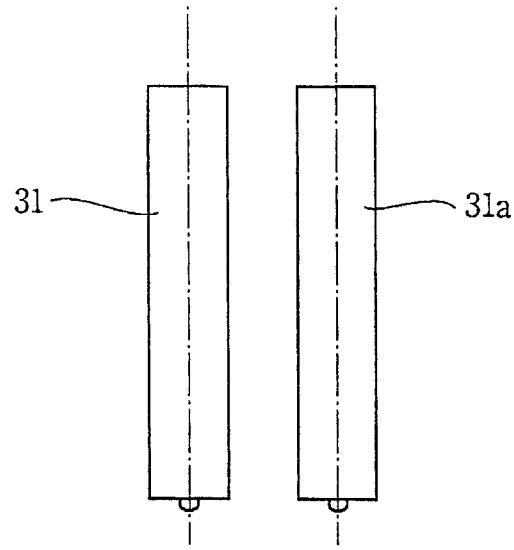
FIG. 15 is a schematic diagram showing a modification wherein two split pin dispensers are provided to eject two types of split pins.

In order to insert split pins having different lengths and diameters, two split pin dispensers 31 and 31a are provided in parallel to each other in the multiple tool unit 13 as shown in FIG. 15.

Figure 16:
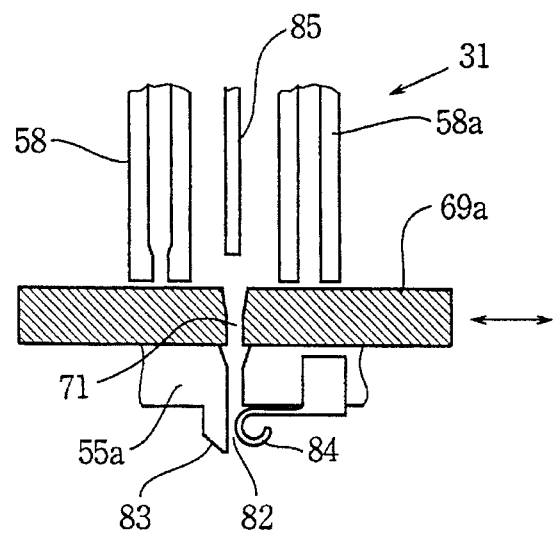
FIG. 16 is a schematic sectional view of the split pin dispenser wherein split pins having different diameters are ejected.

Alternatively, as shown in FIG. 16, the split pin dispenser 31 may be modified to have two pipes 58 and 58a, each of which for providing split pins having a diameter different from that of the split pins in the other. A block 69a provided in the space 55b of the housing 55 is adapted to move selectively to the right and the left so as to align the transporting hole 71 thereof with one of the pipes 58 and 58a. In the present modification, the difference of the diameters must be relatively small. The present modification is more suitable in inserting split pins made with plates having different thickness, in case of which, the inner diameters of the split pins differ although the outer diameter are the same.

If the portions in the housing which must be calibrated in accordance with the diameter and the length of the split pin can be exchanged, split pins of various sizes may be injected using only one dispenser 31. Namely, lower portion of the housing 55 including the pipe 58, push rod 85, block 69, guide 83 and the holding spring 84 are assembled into a detachable unit so as to be exchanged with another.

The split pin dispenser 31 may be further modified to inject other parts beside the split pins. For example, a coil spring may be inserted in a hole in the PCB substrate to form a throughhole, or a rod may be inserted in a hole if a lead is not run therethrough.

The multiple tool unit 13 may be attached and detached manually instead of automatically to obtain similar effect of the invention.

While the presently preferred embodiments of the present invention has been shown and described, it is to be understood that these disclosures are for the purpose of illustration and that various changes and modifications may be made without departing from the scope of the invention as set forth in the appended claims.

What is claimed is:

1. An apparatus for manufacturing a printed circuit board, comprising:
   a work table for mounting a PCB substrate;
   a work head for attaching a cutting tool for cutting the PCB substrate, and a pin dispenser for inserting a pin into a hole formed in the PCB substrate;
   a driver for moving the work head in a horizontal direction and in a vertical direction;
   a data processor for supplying data signals for operating the cutting tool, and pin dispenser;
   controller means responsive to the data signals for controlling operation of the driver, cutting tool, and pin dispenser, whereby the PCB substrate is made into a printed circuit board.

2. The apparatus according to claim 1 further comprising a solder applicator to be attached to the work head for applying solder on the PCB substrate.

3. The apparatus according to claim 1 further comprising a heater for heating solder on the PCB substrate.

4. The apparatus according to claim 1 wherein the pin is a split pin for forming a throughhole in the PCB substrate.

5. The apparatus according to claim 1 wherein the pin dispenser and the solder applicator are provided on a multiple tool unit to be attached to the work head.

6. The apparatus according to claim 1 wherein the pin dispenser has means for dispensing the pin one by one.

7. The apparatus according to claim 5 wherein the work head has holding means for holding the multiple tool head thereon.

8. The apparatus according to claim 6 wherein the pin dispenser has means for inserting the pin into the hole of the PCB substrate.

9. An apparatus for manufacturing a printed circuit board, comprising:
   a work table for mounting a PCB substrate;
   a work head for attaching a cutting tool for cutting the PCB substrate, and a pin dispenser for inserting a pin into a hole formed in the PCB substrate;
   a driver for moving the work head in a horizontal direction and in a vertical direction;
   input means for providing data necessary for manufacturing the printed circuit,
   the data including data representing the position and the shape of a circuit pattern of the printed circuit board, data representing the position of the hole, data representing the diameter of the hole, and an instruction for forming the hole into a throughhole;
   a data processor responsive to the data for supplying data signals for operating the cutting tool, and pin dispenser;
   controller means responsive to the data signals for controlling operation of the driver, cutting tool, and pin dispenser, whereby the PCB substrate is made into a printed circuit board.

10. The apparatus according to claim 9 further comprising a solder applicator to be attached to the work head for applying solder on the PCB substrate.

11. The apparatus according to claim 9 further comprising a heater for heating solder on the PCB substrate.

12. The apparatus according to claim 9 wherein the pin is a split pin for forming a throughhole in the PCB substrate.

13. The apparatus according to claim 10 wherein the pin dispenser and the solder applicator are provided on a multiple tool unit to be attached to the work head.

14. The apparatus according to claim 9 wherein the pin dispenser has means for dispensing the pin one by one.

15. The apparatus according to claim 13 wherein the work head has holding means for holding the multiple tool head thereon.

16. The apparatus according to claim 14 wherein the pin dispenser has means for inserting the pin into the hole of the PCB substrate.

17. The apparatus according to claim 10 wherein the quantity of the applied solder is adjusted in accordance with the diameter data of the hole.

18. The apparatus according to claim 11 wherein the quantity for heating the solder is adjusted in accordance with the data of the printed circuit board.

* * * * *